United States Patent
Foust et al.

(10) Patent No.: US 7,541,671 B2
(45) Date of Patent: Jun. 2, 2009

(54) ORGANIC ELECTRONIC DEVICES HAVING EXTERNAL BARRIER LAYER

(75) Inventors: Donald Franklin Foust, Glenville, NY (US); William Francis Nealon, Gloversville, NY (US); Jie Liu, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 17 days.

(21) Appl. No.: 11/095,199

(22) Filed: Mar. 31, 2005

(65) Prior Publication Data
US 2006/0226523 A1 Oct. 12, 2006

(51) Int. Cl.
H01L 23/48 (2006.01)

(52) U.S. Cl. ............... 257/688; 257/680; 257/E23.177; 257/E25.008; 438/82; 313/512

(58) Field of Classification Search ............ 438/82; 313/512; 257/680, E25.008, 688, E23.177
See application file for complete search history.

(56) References Cited

U.S. PATENT DOCUMENTS

| | | | |
|---|---|---|---|
| 5,757,126 A * | 5/1998 | Harvey et al. ............... 313/506 |
| 6,081,071 A * | 6/2000 | Rogers ....................... 313/512 |
| 6,150,187 A | 11/2000 | Zyung et al. |
| 6,355,125 B1 | 3/2002 | Tahon et al. |
| 6,537,688 B2 * | 3/2003 | Silvernail et al. ........... 428/690 |
| 6,576,351 B2 * | 6/2003 | Silvernail .................... 428/690 |
| 6,835,950 B2 | 12/2004 | Brown et al. .................. 257/40 |
| 6,949,825 B1 * | 9/2005 | Guenther et al. ............ 257/725 |
| 2002/0024096 A1 | 2/2002 | Yamazaki et al. |
| 2002/0068143 A1 | 6/2002 | Silvernail et al. |
| 2002/0125484 A1 * | 9/2002 | Silvernail et al. ............. 257/79 |
| 2002/0140347 A1 * | 10/2002 | Weaver ....................... 313/506 |
| 2003/0062527 A1 | 4/2003 | Kumar et al. |
| 2003/0080677 A1 * | 5/2003 | Mikhael et al. ............. 313/504 |
| 2003/0164497 A1 * | 9/2003 | Carcia et al. .................. 257/40 |
| 2003/0184219 A1 * | 10/2003 | Duggal et al. ............... 313/506 |
| 2004/0031977 A1 | 2/2004 | Brown et al. |
| 2004/0195967 A1 * | 10/2004 | Padiyath et al. ............. 313/512 |
| 2005/0007517 A1 * | 1/2005 | Anandan ....................... 349/69 |
| 2005/0023974 A1 | 2/2005 | Chwang et al. ............. 313/512 |
| 2005/0146267 A1 * | 7/2005 | Lee et al. ..................... 313/506 |
| 2005/0224935 A1 * | 10/2005 | Schaepkens et al. ........ 257/678 |

OTHER PUBLICATIONS

"PCT Search Report for US2006002955; Dated May 10, 2006"; (5 pages).

* cited by examiner

*Primary Examiner*—Howard Weiss
*Assistant Examiner*—John C Ingham
(74) *Attorney, Agent, or Firm*—Patrick K. Patnode

(57) ABSTRACT

An organic device package includes a flexible substrate having a topside and a bottom side. Further, the organic device package includes an organic electronic device having a first side and a second side disposed on the topside of the flexible substrate. In addition, the organic device package includes a first barrier layer disposed on the bottom side of the flexible substrate.

6 Claims, 6 Drawing Sheets

ORGANIC ELECTRONIC DEVICES HAVING EXTERNAL BARRIER LAYER

STATEMENT REGARDING FEDERALLY SPONSORED RESEARCH & DEVELOPMENT

This invention was made with Government support under contract number 70NANB3H3030. The Government has certain rights in the invention.

BACKGROUND

The invention relates generally to organic electronic devices, and more particularly to organic lighting devices.

In recent years, organic electronic devices, such as, but not limited to, organic light emitting devices, organic photovoltaic cells, organic electrochromic devices, organic transistors, organic integrated circuits, and organic sensors, have attracted much attention as high performance alternatives to silicon electronic devices due to low cost and compatibility with flexible substrates.

In the last decade, tremendous progress has been made in the area of organic electronic devices. Previously, liquid crystal displays (LCDs) were employed for most display applications. However, the LCD displays involve high production and commercial expenses. Currently, organic electronic devices, such as, but not limited to, organic light emitting devices, are being increasingly employed for applications, such as display applications and area lighting applications.

As will be appreciated by one skilled in the art, an organic light emitting device, such as an organic light emitting diode (OLED), includes a stack of thin organic layers sandwiched between two electrodes. The organic layers comprise at least one emissive layer. Other layers may include a hole injection layer, a hole transport layer, and an electron transport layer. Upon application of an appropriate voltage to the OLED lighting device, where the voltage is typically between 2 and 10 volts, the injected positive and negative charges recombine in the emissive layer to produce light. Further, the structure of the organic layers and the choice of anode and cathode are designed to maximize the recombination process in the emissive layer, thus maximizing the light output from the OLED device. This structure eliminates the need for bulky and environmentally undesirable mercury lamps and yields a thinner, more versatile and more compact display or area lighting device. In addition, the OLEDs advantageously consume little power. This combination of features enables OLED displays to advantageously communicate more information in a more engaging way while adding less weight and taking up less space.

Currently, organic electronic devices, such as OLEDs, typically include a glass substrate. The glass substrate permits light to escape from the OLEDs, while preventing exposure of the OLED to moisture and oxygen. As will be appreciated, moisture and oxygen present in the atmosphere are known in the art to produce deleterious effects such as degradation of optical and/or electrical properties of the OLEDs. For example, exposing organic materials in the OLEDs to oxygen and moisture may severely limit the lifetime of the OLEDs. Further, moisture and oxygen are known in the art to increase "dark spots" and pixel shrinkage in connection with OLEDs.

Generally, the OLEDs are manufactured employing a batch process. However, in order to reduce the cost of manufacture, it may be desirable to process the devices in a continuous fashion. One mechanism for facilitating continuous processing is to implement a roll-to-roll flexible substrate onto which the OLEDs are fabricated. Consequently, substrates have migrated from rigid glass to flexible glass or plastic. Employing plastic substrates in the fabrication of OLEDs generally leads to the use of plastic substrates having internal barrier layers or the use of a plastic substrates having barrier properties to prevent moisture and oxygen from penetrating through the plastic substrates. Both flexible glass and barrier-coated plastic substrates tend to be fragile entailing considerable attention to prevent loss of hermetic properties during processing. Furthermore, processing steps such as scribing or embossing that are typically employed to generate fine features in the electrodes may result in physical damage to the fragile substrates.

It may therefore be desirable to develop a technique to facilitate cost-effective, continuous processing of OLEDs on a flexible, robust plastic substrate without the barrier layer, while ensuring that the OLEDs do not suffer from permeating of environmental elements once they are ready for implementation, thereby circumventing the limitations of current techniques.

BRIEF DESCRIPTION

Briefly, in accordance with aspects of the present technique an organic device package is presented. The organic device package includes a flexible substrate having a topside and a bottom side. Further, the organic device package includes an organic electronic device having a first side and a second side disposed on the topside of the flexible substrate. In addition, the organic device package includes a first barrier layer disposed on the bottom side of the flexible substrate.

In accordance with another aspect of the present technique, a method of fabricating an organic device package is presented. The method includes providing a flexible substrate having a topside and a bottom side. Additionally, the method includes disposing an organic electronic device having a first side and second side on the topside of the flexible substrate. The method also includes disposing a first barrier layer on the bottom side of the flexible substrate. Furthermore, the method includes disposing a second barrier layer proximate to the first side of the organic electronic device such that a periphery of the second barrier layer is adapted to wrap around edges of the organic device package. Also, the method includes coupling the second barrier layer to a side of the first barrier layer opposite the flexible substrate.

In accordance with yet another aspect of the present technique, an organic device package is presented. The organic device package includes a flexible substrate having a topside and a bottom side. In addition, the organic device package includes an organic electronic device having a first side and second side disposed on the topside of the flexible substrate. Further, the organic device package also includes a first barrier layer having an inner surface and an outer surface disposed on the bottom side of the flexible substrate. Additionally, the organic device package includes a second barrier layer having an inner surface and an outer surface disposed proximate to the first side of the organic electronic device. The organic device package also includes an edge encapsulating material disposed about the perimeter of the organic electronic device between the first and second barrier layers, where the edge encapsulating material is configured to hermetically seal peripheral edges of the organic device package.

In accordance with yet another aspect of the present technique, a method of fabricating an organic device package is presented. The method includes providing a flexible substrate having a topside and a bottom side. The method also includes disposing an organic electronic device having a first side and a second side on the topside of the flexible substrate. Further, the method includes disposing a first barrier layer having an inner surface and an outer surface on the bottom side of the flexible substrate. In addition, the method includes disposing a second barrier layer having an inner surface and an outer surface proximate to the first side of the organic electronic device. Also, the method includes coupling the first and second barrier layers.

In accordance with yet another aspect of the present technique, an organic device package is presented. The organic device package includes a flexible substrate having a topside and a bottom side. Further, the organic device package includes an organic electronic device having a first side and a second side disposed on the topside of the flexible substrate. In addition, the organic device package includes a first barrier layer having a first inner surface and a first outer surface disposed on the bottom side of the flexible substrate. The organic device package also includes a second barrier layer having a second inner surface and a second outer surface disposed proximate to the first side of the organic electronic device, where the second barrier layer comprises a periphery adapted to wrap around edges of the organic device package such that the periphery of the second barrier layer is coupled to a side of the first barrier layer opposite the flexible substrate. Additionally, the organic device package includes a functional layer having a first side and a second side disposed on a portion of the first outer surface, where the functional layer is configured to enhance an output of the organic device package.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Sensitive OLED components have been encapsulated by a variety of techniques to circumvent the deleterious effects of moisture and oxygen. For example, the use of a barrier layer prevents the permeation of moisture and oxygen from the outside environment to the OLED region. Currently, the substrates employed to fabricate the encapsulated OLEDs include rigid glass, flexible glass or plastic. Use of plastic substrates may necessitate the use of a barrier coating to prevent moisture and oxygen from penetrating through the substrate. Further, both flexible glass and barrier-coated plastic substrates tend to be fragile, and may require considerable attention to prevent loss of hermetic properties during processing and future usage. It may therefore be desirable to develop a technique for the cost-effective processing of organic electronic devices, such as, OLEDs, while ensuring that the hermeticity of the organic electronic device is maintained. The techniques discussed herein address some or all of these issues.

Figure 1:
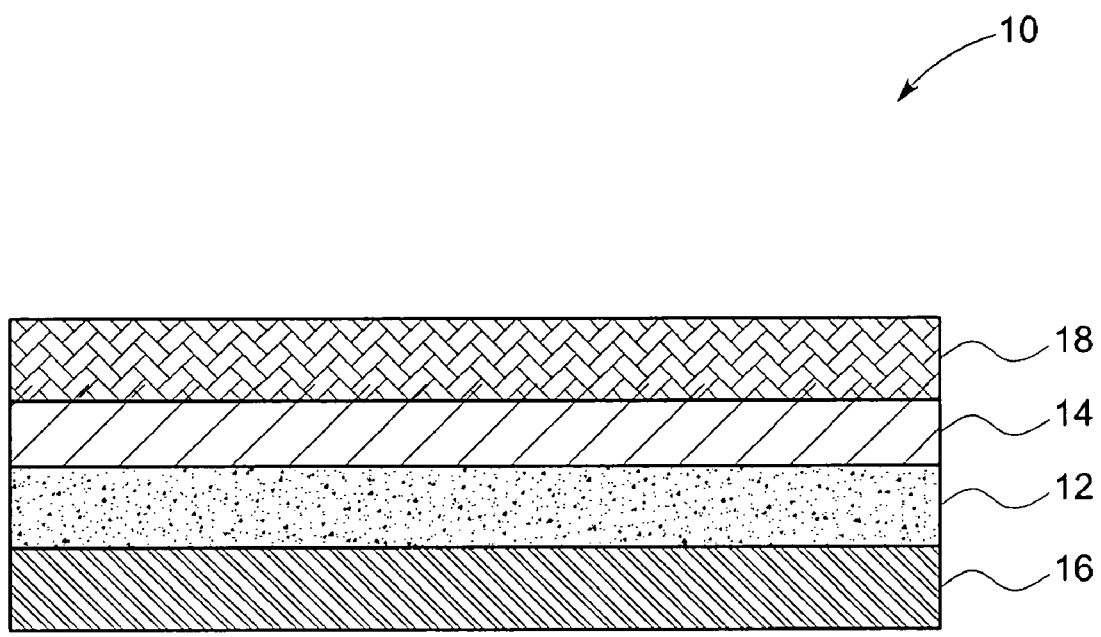
FIG. 1 is a cross-sectional side view illustrating an exemplary organic device package, according to aspects of the present technique.

Referring to FIG. 1, a cross-sectional side view 10 of an exemplary embodiment of an organic device package is illustrated. As will be appreciated by one skilled in the art, the figures are for illustrative purposes and are not drawn to scale. In a presently contemplated configuration, the organic device package 10 is illustrated diagrammatically as including a substrate 12 having a topside and a bottom side. In accordance with aspects of the present technique, the substrate 12 may include a flexible substrate.

According to other aspects of the present technique, the flexible substrate 12 may include materials, such as, but not limited to, plastic, a metal foil, or flexible glass. Furthermore, the flexible substrate 12 may include a flexible substrate that is compatible with roll-to-roll processing. The flexible substrate 12 is generally thin, having a thickness in a range from about 0.25 mils to about 50.0 mils, and preferably in a range from about 0.5 mils to about 10.0 mils. The term "flexible" generally means being capable of being bent into a shape having a radius of curvature of less than approximately 100 cm. Advantageously, implementing a roll of film for the flexible substrate 12 enables the use of high-volume, low cost, reel-to-reel processing and fabrication of the organic device package. The roll of film may have a width of 1 foot, for example, on which a number of components (e.g., organic electronic devices) may be fabricated. The flexible substrate 12 may comprise a single layer or may comprise a structure having a plurality of adjacent layers of different materials. By using rollable substrates, manufacturability of the device may be improved.

Moreover, the flexible substrate 12 may have an index of refraction in a range from about 1 to about 2.5, and preferably in a range from about 1 to about 2. The flexible substrate 12 generally may comprise any flexibly suitable polymeric material. Additionally, the flexible substrate 12 may comprise polycarbonates, polyarylates, polyetherimides, polyethersulfones, polyimides, such as Kapton H or Kapton E (made by Dupont) or Upilex (made by UBE Industries, Ltd.), polynorbornenes, such as cyclic-olefins (COC), liquid crystal polymers (LCP), such as polyetheretherketone (PEEK), polyethylene terephthalate (PET), and polyethylene naphtalate (PEN).

Depending on the application, the flexible substrate 12 may also comprise a substantially transparent film, as will be described in greater detail hereinafter. As used herein, "substantially transparent" refers to a material allowing a total transmission of at least about 50%, preferably at least about 80%, of visible light (i.e., having a wave length in a range from about 400 nm to about 700 nm).

In addition, the organic device package 10 may include an organic electronic device 14 having a first side and a second side disposed on the topside of the flexible substrate 12. The organic electronic device 14 may include one of an organic light emitting device (OLED), an organic photovoltaic cell, an organic photo-detector, an organic electrochromic device, an organic sensor, or combinations thereof. Also, in one embodiment, the organic electronic device 14 may include a number of organic semiconductor layers disposed between two conductors or electrodes. Accordingly, while not illustrated in FIG. 1, the electrodes of the organic electronic device 14 are electrically coupled to an external current source, which is used to initiate the light producing reactions in the organic electronic device 14. In accordance with aspects of the present technique, the organic electronic device 14 may be fabricated onto the flexible substrate 12 using a roll-to-roll process.

In accordance with exemplary aspects of the present technique, a first barrier layer 16 may be disposed on the bottom side of the flexible substrate 12. In accordance with one embodiment, the first barrier layer 16 may be disposed after fabrication of the organic electronic device 14 onto the flexible substrate 12 is complete. The first barrier layer 16 may be configured to prevent the diffusion of moisture and oxygen into the region of the organic electronic device 14 through the flexible substrate 12. The first barrier layer 16 may be disposed or otherwise formed on the surface of the flexible substrate 12 opposing the surface on which the organic electronic device 14 is fabricated such that the first barrier layer 16 completely covers the bottom side of the flexible substrate 12. The first barrier layer 16 may be disposed at a thickness in a range from about 10 nm to about 10 mm, and preferably in a range from about 1000 nm to about 1 mm.

Further, it is generally desirable to choose the thickness of the first barrier layer 16 that does not impede the transmission of light through the flexible substrate 12. For example, it may be advantageous to choose the thickness of the first barrier layer 16 such that the first barrier layer 16 causes a reduction in light transmission of less than about 20%, and preferably less than about 5%. It is also desirable to choose a first barrier layer material and thickness that does not significantly reduce the flexibility of the substrate 12, and whose properties do not significantly degrade with bending. The first barrier layer 16 may be disposed by any suitable deposition techniques, such as physical vapor deposition, plasma-enhanced chemical-vapor deposition (PECVD), radio-frequency plasma-enhanced chemical-vapor deposition (RFPECVD), expanding thermal-plasma chemical-vapor deposition (ETPCVD), reactive sputtering, electron-cyclodrawn-residence plasma-enhanced chemical-vapor deposition (ECRPECVD), inductively coupled plasma-enhanced chemical-vapor deposition (ICPECVD), sputter deposition, evaporation, atomic layer deposition (ALD), or combinations thereof.

The first barrier layer 16 may include materials such as, but not limited to, organic coating, inorganic coating, organic hybrid coating, inorganic hybrid coating, or metal foils, for instance. Organic coating materials may comprise carbon, hydrogen, oxygen and optionally, other minor elements, such as sulfur, nitrogen, silicon, etc., depending on the types of reactants. Suitable reactants that result in organic compositions in the coating are straight or branched alkanes, alkenes, alkynes, alcohols, aldehydes, ethers, alkylene oxides, aromatics, etc., having up to 15 carbon atoms. Inorganic and ceramic coating materials typically comprise oxide, nitride, carbide, boride, oxynitride, oxycarbide, or combinations thereof of elements of Groups IIA, IIIA, IVA, VA, VIA, VIIA, IB, and IIB; metals of Groups IIIB, IVB, and VB, and rare-earth metals. For example, silicon carbide can be deposited onto a substrate by recombination of plasmas generated from silane ($SiH_4$) and an organic material, such as methane or xylene. Silicon oxycarbide can be deposited from plasmas generated from silane, methane, and oxygen or silane and propylene oxide. Silicon oxycarbide also can be deposited from plasmas generated from organosilicone precursors, such as tetra-ethoxysilane (TEOS), hexamethyldisiloxane (HMDSO), hexamethyldisilazane (HMDSN), or octamethylcyclotetrasiloxane (D4). Silicon nitride can be deposited from plasmas generated from silane and ammonia. Aluminum oxycarbonitride can be deposited from a plasma generated from a mixture of aluminum titrate and ammonia. Other combinations of reactants, such as metal oxides, metal nitrides, metal oxynitrides, silicon oxide, silicon nitride, silicon oxynitrides may be chosen to obtain a desired coating composition.

Further, the first barrier layer 16 may comprise hybrid organic/inorganic materials or multilayer organic/inorganic materials. The organic materials may comprise acrylates, epoxies, epoxyamines, xylenes, siloxanes, silicones, etc. The choice of the particular reactants can be appreciated by those skilled in the art. Most metals may also be suitable for the first barrier layer 16 in applications where transparency of the flexible substrate 12 is not required. As will be appreciated, the flexible substrate 12 may comprise a composition, which incorporates the first barrier layer 16 to provide a hermetic substrate.

In accordance with exemplary aspects of the present technique, a hermetic barrier may be applied to the organic device package. In one embodiment, the hermetic barrier may be a second barrier layer 18 that may be disposed proximate to the first side of the organic electronic device 14. Additionally, the second barrier layer 18 may include a material, such as, but not limited to, organic coatings, inorganic coatings, organic hybrid coatings, inorganic hybrid coatings, or metal foils.

The second barrier layer 18 may be disposed at a thickness in a range from about 10 nm to about 10 mm, and preferably in a range from about 1000 nm to about 1 mm. As previously described with reference to the first barrier layer 16, it is generally desirable to choose the thickness of the second barrier layer 18 that does not impede the transmission of light through the flexible substrate 12. For instance, it may be beneficial to choose the material and thickness of the second barrier layer 18 such that the second barrier layer 18 causes a reduction in light transmission of less than about 20%, and preferably less than about 5%. Also, as previously described, the second barrier layer 18 may be disposed by any suitable deposition techniques, such as plasma-enhanced chemical-vapor deposition (PECVD), radio-frequency plasma-enhanced chemical-vapor deposition (RFPECVD), expanding thermal-plasma chemical-vapor deposition (ETPCVD), reactive sputtering, electron-cyclodrawn-residence plasma-enhanced chemical-vapor deposition (ECRPECVD), inductively coupled plasma-enhanced chemical-vapor deposition (ICPECVD), sputter deposition, evaporation, atomic layer deposition (ALD), or combinations thereof.

In one embodiment, the second barrier layer 18 may be disposed such that the periphery of the second barrier layer 18 is patterned to wrap around edges of the organic device package such that the periphery of the second barrier layer 18 may be coupled to a side of the first barrier layer 16 opposite the flexible substrate 12. In other words, the periphery of the second barrier layer 18 may be configured to be coupled to the second side of the first barrier layer 16 thereby hermetically sealing the organic device package. This exemplary embodiment will be illustrated and described further with reference to FIG. 2. In an alternate embodiment, an edge encapsulating material configured to hermetically seal the peripheral edges of the organic device package may be disposed along the perimeter of the organic electronic device 14 between the first and second barrier layers 16, 18.

According to one embodiment, the first and second barrier layers 16, 18 may be formed using a first material. As previously described, the first material may include one of an organic coating, an inorganic coating, an organic hybrid coating, an inorganic hybrid coating, a metal foil or combinations thereof. Alternatively, the second barrier layer 18 may be formed employing a second material, where the second material is different from the first material.

Depending on the application, the flexible substrate 12 and the first and second barrier layers 16, 18 may be opaque or transparent. As will be appreciated, for bottom-emitting OLED structures, light may be transmitted from the organic electronic device 14 via the flexible substrate 12 and the first barrier layer 16. Accordingly, for the bottom-emitting OLED structures, the flexible substrate 12 and the first barrier layer 16 may be substantially transparent, while the second barrier layer 18 may be opaque. As previously described, "substantially transparent" refers to a material allowing a total transmission of at least about 50%, preferably at least about 80%, of visible light. The second barrier layer 18 may include a reflective material, such as, but not limited to a metal. For example, the metal may include aluminum (Al), silver (Ag) or chromium (Cr). Also, in accordance with aspects of the present technique, a material having a coating of a reflective material may also be employed as the second barrier layer 18. For example, a metal may be coated on glass or plastic. In accordance with aspects of the present technique, the second barrier layer 18 with the reflective coating (not shown) may be implemented to reflect any radiation emitted away from the substantially transparent flexible substrate 12 and direct such radiation toward the flexible substrate 12 such that the total amount of radiation emitted in this direction is increased. Also, the second barrier layer 18 may advantageously include a material to prevent diffusion of reactive environmental elements, such as oxygen and moisture, into the organic electronic device 14.

However, for top-emitting OLED structures, light may be transmitted from the organic electronic device 14 through the second barrier layer 18. Consequently, the flexible substrate 12 and the first barrier layer 16 may be opaque, while the second barrier layer 18 may be substantially transparent. In this embodiment, the first barrier layer 16 may include a metal. Alternatively, the first barrier layer 16 may include glass or plastic coated with a reflective material. As previously described, the first barrier layer 16 with the reflective coating (not shown) may be implemented to reflect any radiation away from the first barrier layer 16 toward the second barrier layer 18 thereby augmenting the radiation emitted in this direction. Further, the first barrier layer 18 may also include a material to provide hermeticity to the organic device package 10, as previously described.

Furthermore, in the case of transparent OLED structures, in which light is transmitted out of both the top and the bottom of the organic device package 10, the flexible substrate 12 and the first and second barrier layers 16, 18 may be configured to be substantially transparent. As will be appreciated, in this embodiment, the use of a reflective coating on the first or second barrier layers 16, 18 may be omitted as light is transmitted out of both the top and bottom of the organic device package 10.

In addition, the first and second barrier layers 16, 18 may be configured to be sufficiently thin so as not to adversely reduce the flexibility of the organic device package 10. Further, the first and second barrier layers 16, 18 may include a number of layers of various metals or metal compound to further reduce the diffusion of oxygen and moisture into the organic electronic device 14. In one embodiment, inner layers of the first and second barrier layers 16, 18, directly adjacent to the organic electronic device 14, may be reflective while the outer layers comprise non-reflective materials or compounds such as metal oxides, nitrides, carbides, oxynitrides, or oxycarbides which may be implemented to reduce the rate of diffusion of oxygen and water into the organic electronic device 14.

Figure 2:
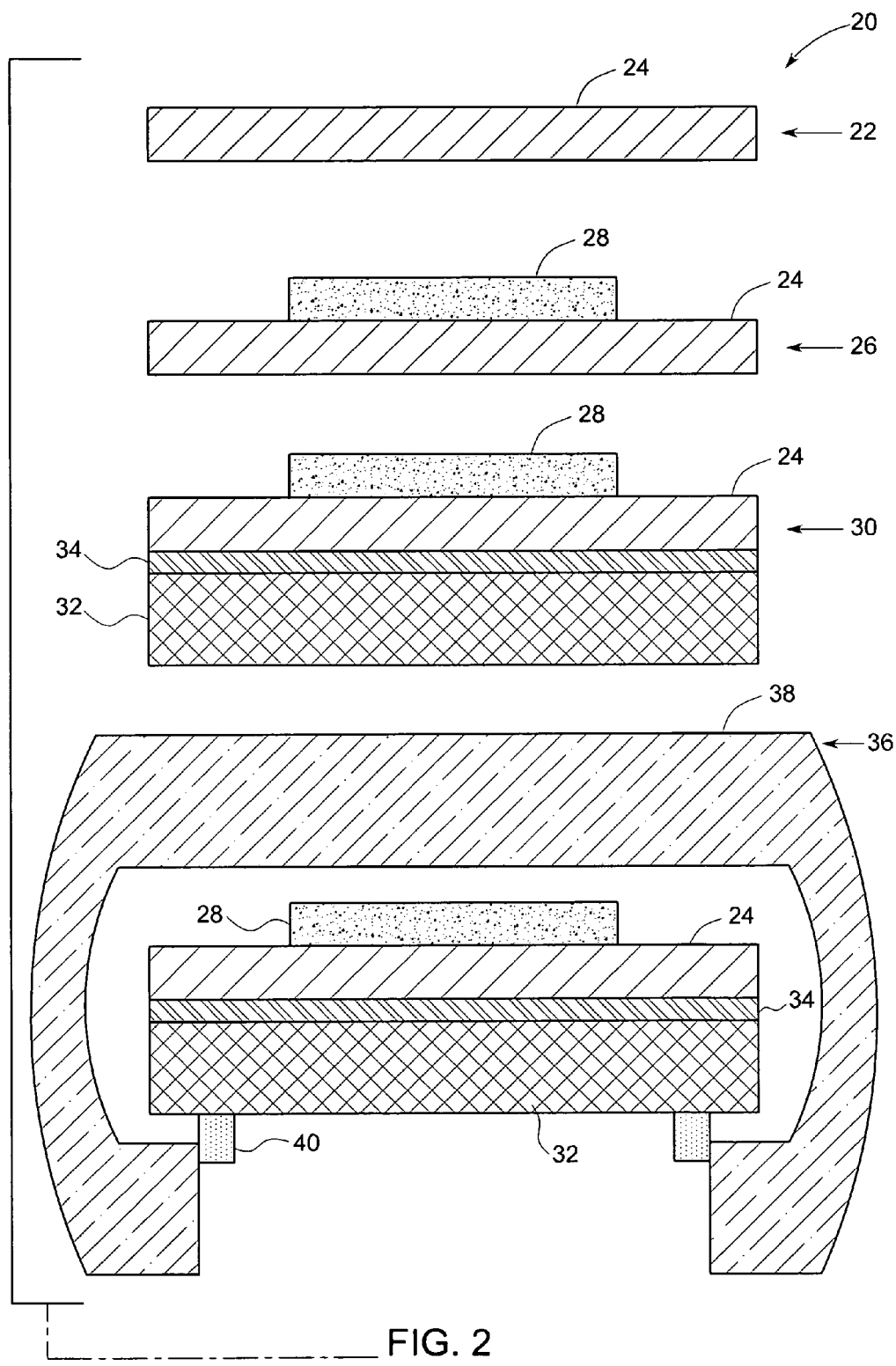
FIG. 2 illustrates an exemplary process of fabricating an organic device package, according to aspects of the present technique.

FIG. 2 illustrates an exemplary process 20 of fabricating an organic device package, in accordance with aspects of the present technique. The process begins at step 22 where a flexible substrate 24 having a topside and a bottom side is selected. As previously described, the flexible substrate 24 may include one of a plastic, a metal foil, or flexible glass. At step 26, an organic electronic device 28 having a first side and a second side may be formed on the topside of flexible substrate 24. The organic electronic device 28 may include one of an OLED, an organic photovoltaic cell, an organic photodetector, an organic electrochromic device, an organic sensor, or combinations thereof. As previously described, the organic electronic device 28 may comprise a number of organic layers sandwiched between two conductive electrodes.

Subsequently, at step 30, a first barrier layer 32 may be disposed on the bottom side of the flexible substrate 24. As previously described, the first barrier layer 32 is configured to prevent the permeation of oxygen and moisture into the organic electronic device 28 which may disadvantageously hamper the operation of the device. The first barrier layer 32 having a topside and a bottom side may be coupled to the flexible substrate 24 via an adhesive layer 34. In other words, the adhesive layer 34 aids in affixing the topside of the first barrier layer 32 to the bottom side of the flexible substrate 24. In this embodiment, the adhesive layer 34 may be chosen to exhibit optically clear properties. For example, the adhesive layer 34 may include one of a curable epoxy, acrylate, thermoplastic and/or combinations thereof, where the curing may require heat, pressure or ultraviolet radiation and/or combinations thereof. Furthermore, a thickness of the adhesive layer 34 may be in a range from about 0.1 micron to about 1 mm. It may be noted that adding the first barrier layer 32 in this fashion allows the first barrier layer 32 to be fabricated at higher or lower processing conditions/temperatures than those the completed organic electronic device 28 can reliably operate.

Further, at step 36, a second barrier layer 38 may be disposed proximate to the first side of the organic electronic device 28. In this embodiment, the second barrier layer 38 is disposed such that a periphery of the second barrier layer 38 wraps around the organic device package. In other words, the periphery of the second barrier layer 38 may be adapted to encapsulate the organic device package such that the periphery of the second barrier layer 38 is coupled to the second side of the first barrier layer 32 thereby hermetically sealing the organic device package.

The coupling between the first and second barrier layers 32, 38 may be achieved via a sealing material 40 configured to couple the first and second barrier layers 32, 38. In the illustrated embodiment, the second barrier layer 38 is coupled to the bottom side of first barrier layer 32 via the sealing material 40. In one embodiment, the sealing material 40 may include epoxy. Alternatively, the sealing material 40 may also include a metal, and/or a metal alloy having a low melting point. For example, the sealing material 40 may include one of a gallium or indium. The metal with a low melting point may include indium, tin, bismuth alloys of indium, alloys of tin, or combinations thereof. Further, the melting point of the metal may be in a range from about 25 degrees centigrade to about 200 degrees centigrade, and preferably in a range from about 100 degrees centigrade to about 150 degrees centigrade. As will be appreciated, the sealing material 40 may include a metal, and/or a metal alloy with a low melting point to circumvent any damage to a plastic substrate or adversely affecting the electrical performance of any organic polymer.

Further, the coupling step may also include heating the organic device package to facilitate coupling the first and second barrier layers 32, 38. Alternatively, the coupling may also be achieved by applying pressure to the organic device package to facilitate coupling the first and second barrier layers 32, 38 via the sealing material 40. Coupling the first and second barrier layers 32, 38 may also be achieved by exposing the organic device package to ultraviolet radiation. In accordance with aspects of the present technique, a combination of heating, applying pressure and exposing the device to ultraviolet radiation may be employed to couple the first and second barrier layers 32, 38.

Figure 3:
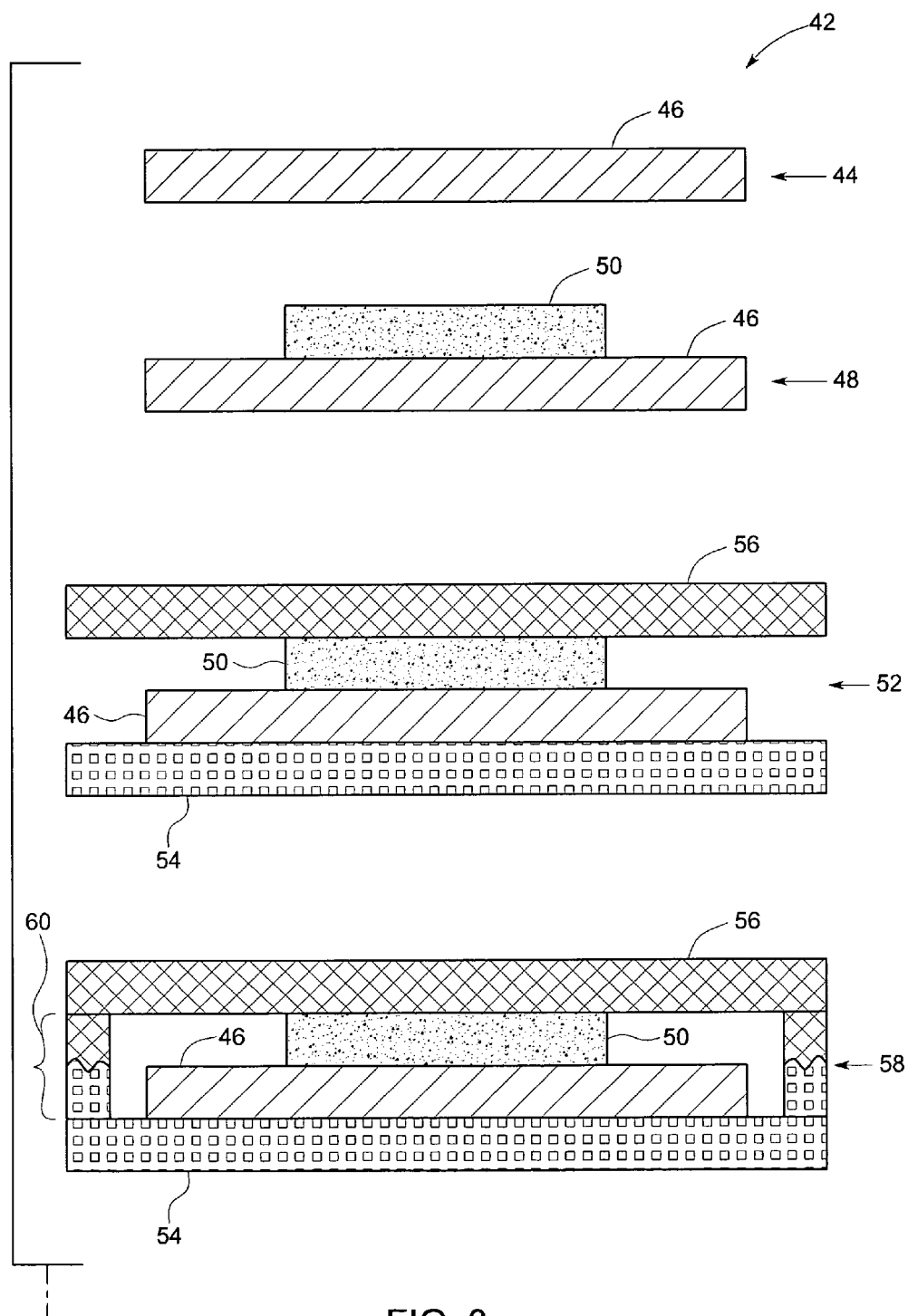
FIG. 3 illustrates another exemplary process of fabricating an organic device package, according to aspects of the present technique.

FIG. 3 illustrates an exemplary process 42 of fabricating an organic device package, in accordance with aspects of the present technique. The process 42 begins at step 44 where a flexible substrate 46 having a topside and a bottom side is selected. Further, at step 48, an organic electronic device 50 having a first side and a second side may be formed on the topside of the flexible substrate 46.

Subsequently, at step 52, a first barrier layer 54 and a second barrier layer 56 may be disposed. In a presently contemplated configuration, the first barrier layer 54 having an inner surface and an outer surface may be disposed on the bottom side of the flexible substrate 46. Also, a bonding material (not shown), such as, but not limited to, epoxy, may be coated on the inner surface of the first barrier layer 54.

As will be appreciated, a bonding material may be defined as a material that undergoes modifications in physical and mechanical properties. Modifications in the structure may be induced either by exposing the bonding material to high-energy radiation or through a chemical process using peroxide. Both methods promote molecular bonding, cross-links, or physical intermixing within the material. The reactions produced by cross-linking depend on the material, and variables in processing, such as a level of irradiation, among other things. Cross-linking may produce significant property benefits, such as, enhanced thermomechanical properties, improved dimensional stability, reduced stress cracking and overall improvement in physical toughness. On exposure to ultraviolet light or temperature, the bonding material may be cured to affix the first barrier layer 54 to the flexible substrate 46.

Similarly, the second barrier layer 56 having an inner surface and an outer surface may be disposed on the topside of the organic electronic device 50. A bonding material (not shown) may be coated on the inner surface of the second barrier layer 56. As previously described, the bonding material facilitates affixing the second barrier layer 56 to the organic electronic device 50.

In one embodiment, the first and second barrier layers 54, 56 may be formed using a first material. As previously described, the first material may include one of an organic coating, an inorganic coating, an organic hybrid coating, an inorganic hybrid coating, a metal foil or combinations thereof. Alternatively, the second barrier layer 56 may be formed employing a second material, where the second material is different from the first material. Also, as previously described, depending on the application of the device, a reflective coating may be disposed on either the first barrier layer 54 or the second barrier layer 56 to facilitate the maneuvering of light in the direction of transmission. However, as will be appreciated, if the organic electronic device 50 is a transparent OLED, then the reflective coating may be omitted.

Following step 52, the first and second barrier layers 54, 56 may be coupled to hermetically seal the organic electronic device 50 at step 58. In accordance with aspects of the present technique, the coupling between the first and second barrier layers 54, 56 may be achieved via the use of an edge encapsulating material 60.

The edge encapsulating material 60 may be disposed about a perimeter of the organic electronic device 50 between the first and second barrier layers 54, 56 thereby hermetically sealing the peripheral edges of organic device package. Accordingly, in one embodiment, the edge encapsulating material 60 may be disposed on the first barrier layer 54. Alternatively, the edge encapsulating material 60 may be disposed on the second barrier layer 56. On the other hand, the edge encapsulating material 60 may be disposed on both the first and second barrier layers 54, 56. Furthermore, in one exemplary embodiment, the edge encapsulating material 60 may be disposed on one of the first barrier layer 54, the second barrier layer 56 or combinations thereof prior to the steps of disposing the first and second barrier layers 54, 56 adjacent to the flexible substrate 46 and the organic electronic device 50 respectively. In accordance with further aspects of the present technique, the edge encapsulating material 60 may be injected around the perimeter of the organic electronic device 50 between the first and second barrier layers 54, 56.

Furthermore, in one embodiment, the edge encapsulating material 60 may include a material similar to the material of the first barrier layer 54. Alternatively, the edge encapsulating material 60 may include a material similar to the material of the second barrier layer 56. In addition, as depicted in the illustrated embodiment, the edge encapsulating material 60 may also include combinations of materials of the first and second barrier layers 54, 56, in accordance with aspects of the present technique.

Additionally, as previously described, the coupling step may also include heating the organic device package to facilitate coupling the first and second barrier layers 54, 56. Alternatively, the coupling may also be achieved by applying pressure to the organic device package to facilitate the coupling of the first and second barrier layers 54, 56 via the edge encapsulating material 60. Coupling the first and second barrier layers 54, 56 may also be achieved by exposing the organic device package to ultraviolet radiation. In accordance with aspects of the present technique, a combination of heating, applying pressure and exposing the organic device package to ultraviolet radiation may be employed to the first and second barrier layers 54, 56.

Figure 4:
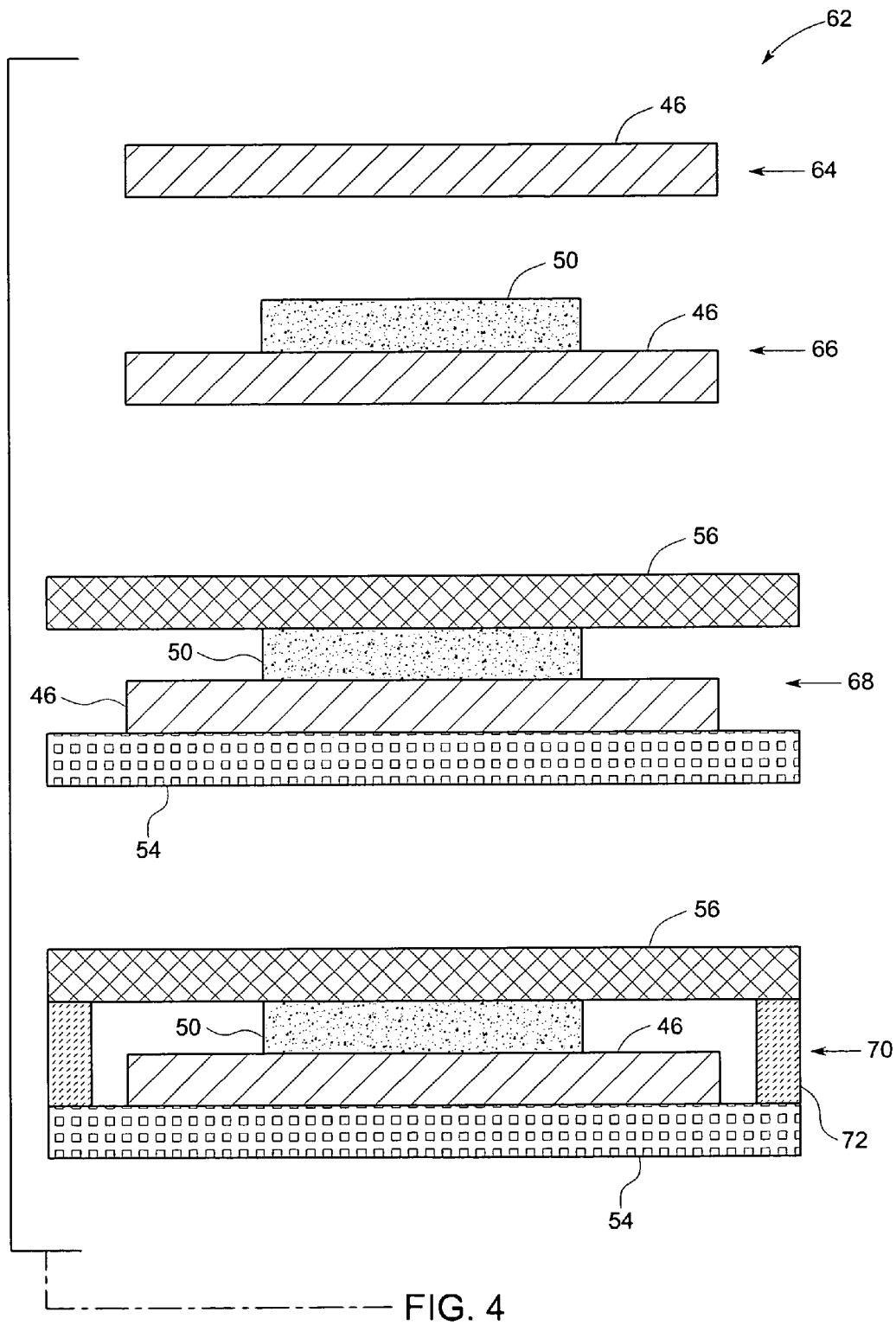
FIG. 4 illustrates yet another exemplary process of fabricating an organic device package, according to aspects of the present technique.

Turning now to FIG. 4, an exemplary process 62 of fabricating an organic device package, in accordance with aspects of the present technique, is illustrated. In the illustrated embodiment, steps 64-68 may be performed as previously described with reference to FIG. 3.

Step 64 is an initial step in the process 62 where a flexible substrate 46 having a topside and a bottom side may be selected. An organic electronic device 50 having a first side and a second side may be formed on the topside of the flexible substrate 46 at step 66.

At step 68, a first barrier layer 54 having an inner surface and an outer surface may be disposed on the bottom side of the flexible substrate 46. In addition, a second barrier layer 56 having an inner surface and an outer surface may be disposed proximate to the first side of the organic electronic device 50. Additionally, as previously described, bonding material (not shown) may be disposed on the respective inner surfaces of the first and second barrier layers 54, 56. The bonding material may be configured to affix the first and second barrier layers 54, 56 to the flexible substrate 46 and the organic electronic device 50 respectively.

Subsequently, at step 70, the first and second barrier layers 54, 56 may be coupled to hermetically seal the organic electronic device 50. The coupling between the first and second barrier layers 54, 56 may be achieved via the use of an edge encapsulating material 72. The edge encapsulating material 72 may be disposed about the perimeter of the organic electronic device 50 between the first and second barrier layers 54, 56 thereby facilitating hermetically sealing the peripheral edges of the organic device package. Furthermore, in the illustrated embodiment of FIG. 4, the edge encapsulating material 72 may include a metal having a low melting point, in accordance with aspects of the present technique. The metal with a low melting point may include indium, tin, bismuth alloys, or combinations thereof. Further, as previously described, the melting point of the metal may be in a range from about 50 degrees centigrade to about 200 degrees centigrade, and preferably in a range from about 100 degrees centigrade to about 150 degrees centigrade.

As previously described, the edge encapsulating material 72 may be disposed on one of the first barrier layer 54, the second barrier layer 56, or combinations thereof. Alternatively, in accordance with further aspects of the present technique, the edge encapsulating material 72 may be injected around the perimeter of the organic electronic device 50 between the first and second barrier layers 54, 56.

Additionally, as previously described, the coupling step may also include one of heating the organic device package, applying pressure to the organic device package, or exposing the organic device package to ultraviolet radiation. In accordance with aspects of the present technique, a combination of heating, applying pressure and exposing the organic device package to ultraviolet radiation may be employed to couple the first and second barrier layers 54, 56.

Figure 5:
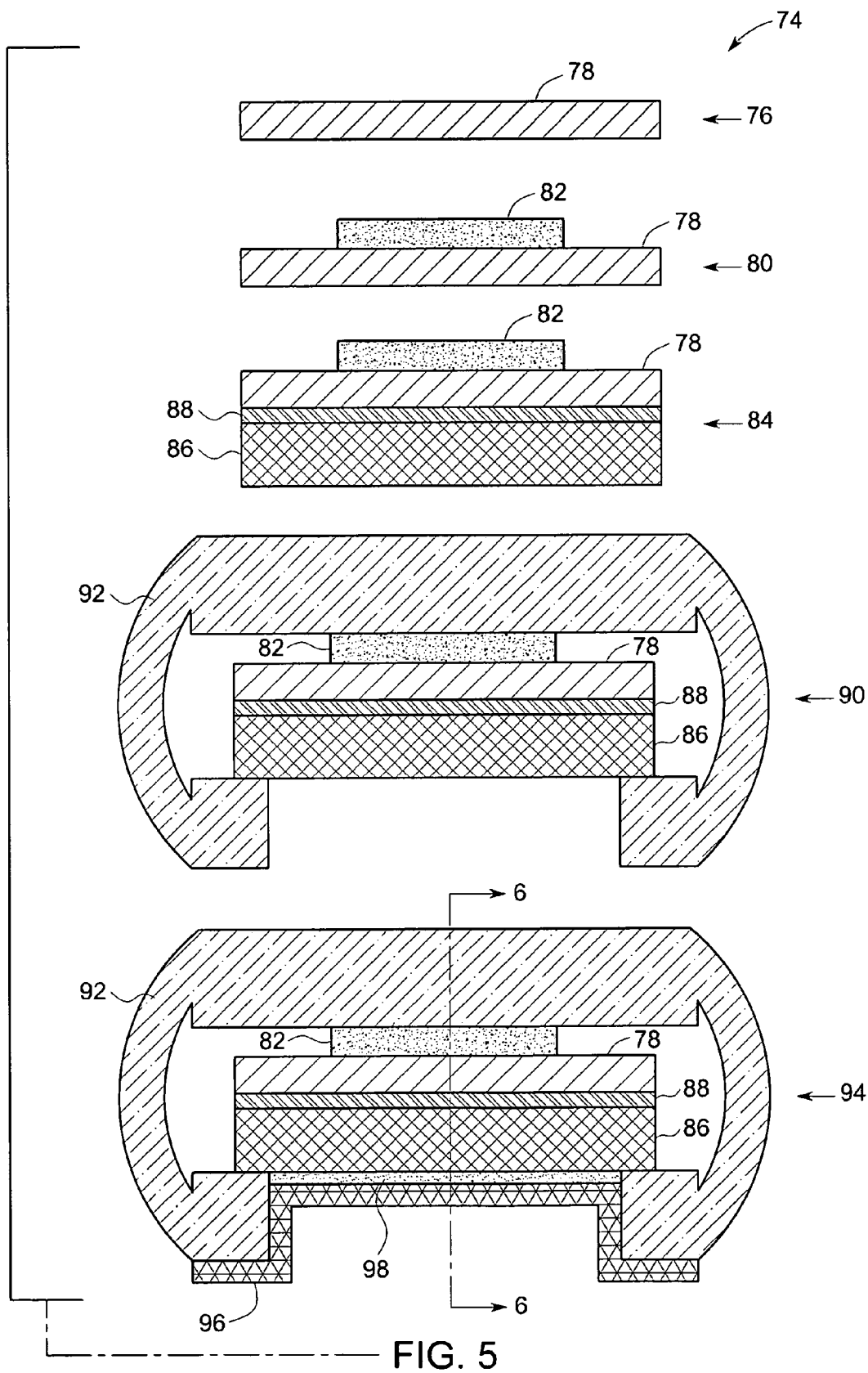
FIG. 5 illustrates another exemplary process of fabricating an organic device package, according to aspects of the present technique.

Turning now to FIG. 5, an exemplary process 74 of fabricating an organic device package, in accordance with aspects of the present technique is illustrated. The process begins at step 76 where a flexible substrate 78 having a topside and a bottom side is selected. As previously described, the flexible substrate 78 may include one of a plastic, a metal foil, or flexible glass. At step 80, an organic electronic device 82 having a first side and a second side may be formed on the topside of flexible substrate 78. As previously noted, the organic electronic device 82 may include one of an OLED, an organic photovoltaic cell, an organic photo-detector, an organic electrochromic device, an organic sensor, or combinations thereof. Further, the organic electronic device 82 may comprise a number of organic layers sandwiched between two conductive electrodes, as previously described.

Subsequently, at step 84, a first barrier layer 86 may be disposed on the bottom side of the flexible substrate 78. As previously described, the first barrier layer 86 is configured to prevent the permeation of oxygen and moisture into the organic electronic device 82 which may disadvantageously hamper the operation of the device. The first barrier layer 86 having a topside and a bottom side may be coupled to the flexible substrate 78 via a first adhesive layer 88. In other words, the first adhesive layer 88 aids in affixing the topside of the first barrier layer 86 to the bottom side of the flexible substrate 78. In this embodiment, the first adhesive layer 88 may be chosen to exhibit optically clear properties. For example, the first adhesive layer 88 may include one of a curable epoxy, acrylate, thermoplastic and/or combinations thereof, where the curing may require heat, pressure or ultraviolet radiation and/or combinations thereof. Furthermore, a thickness of the adhesive layer 88 may be in a range from about 0.1 micron to about 1 mm. It may be noted that adding the first barrier layer 86 in this fashion allows the first barrier layer 86 to be fabricated at higher or lower processing conditions/temperatures than those the completed organic electronic device 82 can reliably operate.

Further, at step 90, a second barrier layer 92 may be disposed proximate to the first side of the organic electronic device 82. In this embodiment, the second barrier layer 92 is disposed such that a periphery of the second barrier layer 92 wraps around the organic device package. In other words, the periphery of the second barrier layer 92 may be adapted to encapsulate the organic device package such that the periphery of the second barrier layer 92 is coupled to the second side of the first barrier layer 86 thereby hermetically sealing the device.

The coupling step may include heating the organic device package to facilitate coupling the first and second barrier layers 86, 92. Alternatively, the coupling may also be achieved by applying pressure to the organic device package to facilitate coupling the first and second barrier layers 86, 92. Coupling the first and second barrier layers 86, 92 may also be achieved by exposing the organic device package to ultraviolet radiation. In accordance with aspects of the present technique, a combination of heating, applying pressure and exposing the organic device package to ultraviolet radiation may be employed to couple the first and second barrier layers 86, 92.

Subsequently, at step 94, one or more functional layers 96 may be disposed on a portion of the first barrier layer 86, in accordance with aspects of the present technique. In the illustrated embodiment, the functional layer 86, having a first side and a second side, is disposed on a portion of a side of the first barrier layer 96 opposite the flexible substrate 78. The functional layers 96 may be configured to enhance an output of the organic device package. Further, the functional layer 96 may be chosen to exhibit desired optical and electrical properties. For example, the functional layer 96 may include one of a photoluminescent material, a color filter, an electrochromic material, a brightness enhancement film, an anti-reflection film or combinations thereof. Furthermore, a thickness of the functional layer 96 may be in a range from about 0.1 micron to about 1 mm. In addition, as illustrated in FIG. 5, a second adhesive layer 98 may be employed to affix the functional layer 96 to the first barrier layer 86.

Figure 6:
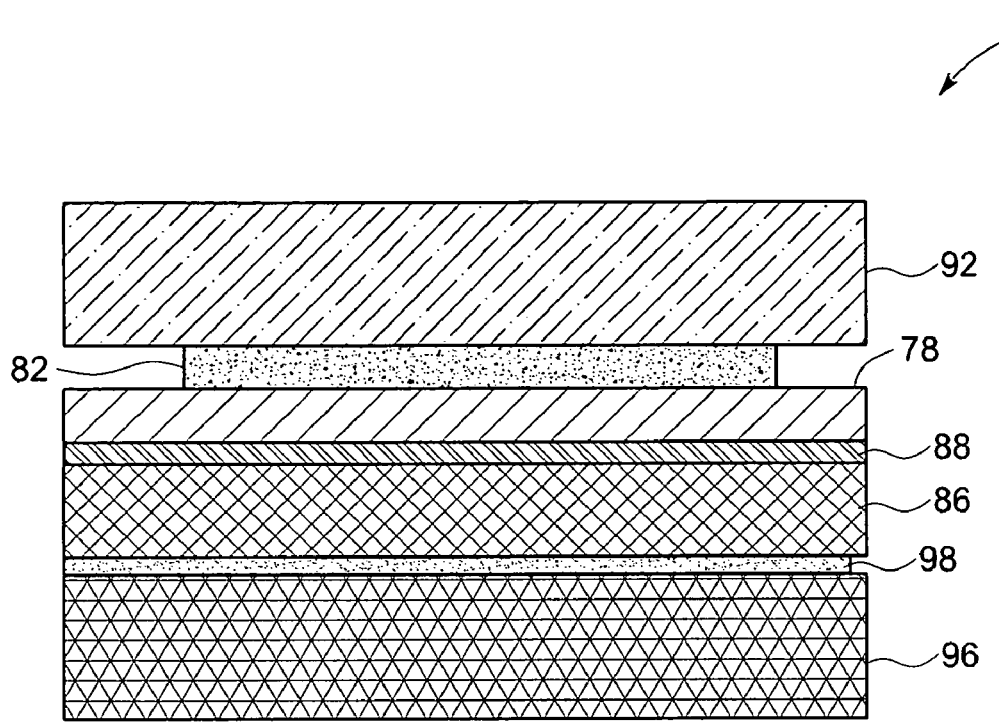
FIG. 6 is a cross-sectional side view of an exemplary embodiment of the organic device package illustrated in FIG. 5 along the cross-sectional line 6-6, according to aspects of the present technique.

FIG. 6 illustrates a cross-sectional side view 100 of the exemplary organic device package of FIG. 5 along the cross-sectional line 6-6. In FIG. 6, the organic device package 100 is depicted as including the functional layer 96 disposed on a portion of the outer surface of the first barrier layer 86.

Figure 7:
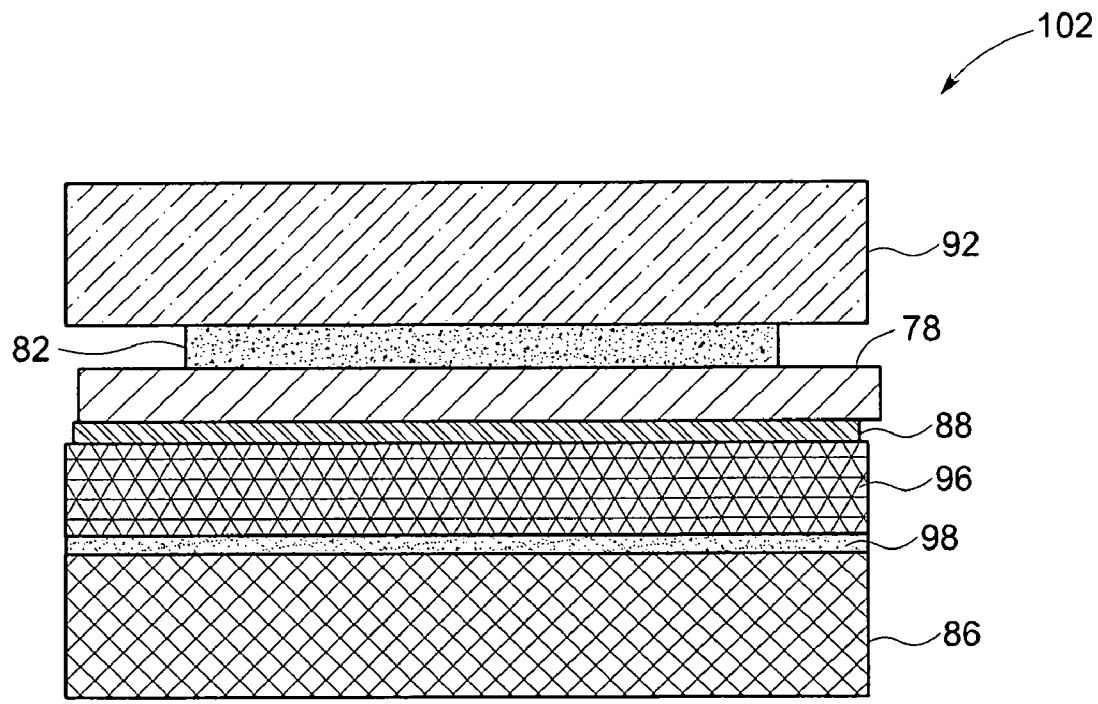
FIG. 7 is a cross-sectional side view of an alternate exemplary embodiment of the organic device package illustrated in FIG. 5, according to aspects of the present technique.

Referring to FIG. 7, a cross-sectional side view 102 of an alternate embodiment of the organic device package depicted in FIG. 5 is illustrated. In the illustrated embodiment, the organic electronic device 82 is disposed on the topside of the flexible substrate 78, as previously described. In this embodiment, the functional layer 96 having a first side and a second side may be disposed on the bottom side of the flexible substrate 78. Further, the first adhesive layer 88 may facilitate affixing the first side of the functional layer 96 to the bottom side of the flexible substrate 78. In addition, the first barrier layer 86 may be disposed on the second side of the functional layer 96. Also, the second adhesive layer 98 may be configured to affix the first barrier layer 86 to the functional layer 96.

The various embodiments of the organic device package and the methods of fabricating the organic device package described hereinabove enable cost-effective fabrication of hermetically sealed organic electronic devices. Further, employing the method of fabrication described hereinabove, rather than continuously processing the organic electronic devices on a fragile, flexible substrate, the organic electronic devices are continuously processed on a flexible, robust substrate without hermetic properties. Subsequent to organic electronic device fabrication, a fragile hermetic barrier is added to the organic electronic device, thereby forming a hermetic organic device package. Processing techniques such as scribing and embossing may be advantageously employed to generate fine features in electrodes of the organic electronic devices without damaging the fragile hermetic barrier. These organic device packages may find application in various fields such as display applications, area lighting applications and other applications.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An organic device package comprising:
a flexible substrate having a topside and a bottom side;
an organic electronic device having a first side and a second side disposed on the topside of the flexible substrate;
a first barrier layer having a first inner surface and a first outer surface disposed on the bottom side of the flexible substrate, wherein the first barrier layer is substantially planar;
a second barrier layer having a second inner surface and a second outer surface disposed proximate to the first side of the organic electronic device, wherein the second barrier layer is substantially planar; and
an edge encapsulating material disposed about the perimeter of the organic electronic device between the first and second barrier layers, wherein the edge encapsulating material is coupled directly to each of the first inner surface of the first barrier layer and the second inner surface of the second barrier layer and configured to hermetically seal peripheral edges of the organic device package.

2. The organic device package of claim 1, further comprising a bonding material disposed on each of the inner surfaces of the first and second barrier layers, wherein the bonding material is configured to affix the first and second barrier layers to the flexible substrate and the organic electronic device respectively.

3. The organic device package of claim 1, wherein the edge encapsulating material is disposed on one of the first barrier layer, or the second barrier layer, or combinations thereof.

4. The organic device package of claim 1, wherein the edge encapsulating material is injected between the first and second barrier layers.

5. The organic device package of claim 1, wherein the edge encapsulating material comprises a material, wherein the material is similar to a material of the first barrier layer, or a material of the second barrier layer, or combinations thereof.

6. The organic device package of claim 1, wherein the edge encapsulating material comprises a metal, or a metal alloy having a low melting point.

* * * * *